(12) United States Patent
Takahashi et al.

(10) Patent No.: US 8,068,379 B1
(45) Date of Patent: Nov. 29, 2011

(54) DYNAMIC RAM

(75) Inventors: Tsutomu Takahashi, Tachikawa (JP); Kouji Arai, Kodaira (JP); Yasushi Takahashi, Urawa (JP); Atsuya Tanaka, Tokorozawa (JP); Shunichi Sukegawa, Plano, TX (US); Shinji Bessho, Plano, TX (US); Masayuki Hira, Dallas, TX (US)

(73) Assignees: Hitachi, Ltd., Tokyo (JP); Texas Instruments Inc., Dallas, TX (US)

( * ) Notice: Subject to any disclaimer, the term of this patent is extended or adjusted under 35 U.S.C. 154(b) by 0 days.

(21) Appl. No.: 09/050,946

(22) Filed: Mar. 31, 1998

(30) Foreign Application Priority Data

Mar. 31, 1997 (JP) .................................. 9-096651

(51) Int. Cl.
 *G11C 8/00* (2006.01)
(52) U.S. Cl. ............... 365/230.03; 365/230.06; 365/63
(58) Field of Classification Search ............ 365/230.03, 365/63, 51, 52, 230.06
See application file for complete search history.

(56) References Cited

U.S. PATENT DOCUMENTS

| | | | | |
|---|---|---|---|---|
| 5,708,620 A | * | 1/1998 | Jeong | 365/230.06 |
| 5,808,955 A | * | 9/1998 | Hwang et al. | 365/230.06 |
| 5,831,924 A | * | 11/1998 | Nitta et al. | 365/230.03 |

FOREIGN PATENT DOCUMENTS

JP   A-2-158995   6/1990

* cited by examiner

*Primary Examiner* — Huan Hoang
(74) *Attorney, Agent, or Firm* — Antonelli, Terry, Stout & Kraus, LLP

(57) ABSTRACT

A plurality of sub word lines each have a length equivalent to the division of a main word line along the extension direction thereof, arranged along a bit line crossing said main word line, and are connected with a plurality of memory cells. A first sub word select line arranged in parallel to the main word line is extended to a plurality of sub arrays arranged in the extension direction of the word line. A second sub word select line is connected to the corresponding one of said first sub word select line to be extended orthogonally to a word line driving circuit area of an adjacent sub array. In the sub word line driving circuit provided for each sub array, a sub word line is selected and deselected by signals supplied from said main word line and said second sub word select line.

14 Claims, 10 Drawing Sheets

CMOS TYPE

NMOS TYPE

VPP: WORD LINE SELECT LEVEL

NOR TYPE

VDD: POWER SUPPLY LEVEL

DYNAMIC RAM

BACKGROUND OF THE INVENTION

The present invention generally relates to a dynamic RAM (Random Access Memory) and, more particularly, to a technique which is effective for use in a dynamic RAM based on divided word line design having a main word line and a sub word line for example.

A divided word line design has been proposed in which a plurality of sub word lines, to which memory cells are connected, for a main word line, are arranged to operate only a memory block in which a memory cell to be selected is arranged, to minimize the memory area to be operated, so as to achieve reduced power consumption and increased speed in a selecting operation of the sub word lines to which memory cells are connected. One example of this divided word line design is disclosed in Japanese Unexamined Patent Publication No. Hei 2-158995. A method of arranging a signal line for sub word selection is disclosed in U.S. Pat. No. 5,359,572.

SUMMARY OF THE INVENTION

Examination by the inventor of the present invention indicates that the conventional divided word line design is mainly intended to reduce power consumption and increase operational speed, without full consideration being given to chip size reduction. To be more specific, if the main word line is divided into sub word lines and a sub word line driving circuit for selecting a sub word line is provided, a select line for selecting one of the plural sub word lines assigned to one main word line and a driving circuit for driving this select line are required. This presents a problem of efficiently laying out these components around a memory array.

It is therefore an object of the present invention to provide a dynamic RAM that realizes high integration while using divided word line design.

In carrying out the invention, and according to one aspect thereof, there is provided a dynamic RAM having a constitution such that a plurality of sub word lines are provided each having a length equivalent to the division of a main word line along the extension direction thereof, arranged along a bit line crossing the main word line, and connected with a plurality of memory cells. A first sub word select line arranged in parallel to the main word line is extended to a plurality of sub arrays arranged in the extension direction of the word line. A second sub word select line is connected to a corresponding one of the first sub word select lines to be extended to a word line driving circuit area of an adjacent sub array. In the sub word line driving circuit provided for each sub array, a sub word line is selected and deselected by signals supplied from the main word line and the second sub word select line.

BRIEF DESCRIPTION OF THE DRAWINGS

These and other objects of the invention will be seen by reference to the description, taken in connection with the accompanying drawing, in which.

DETAILED DESCRIPTION OF PREFERRED EMBODIMENTS

This invention will be described in further detail by way of example with reference to the accompanying drawings.

Figure 1:
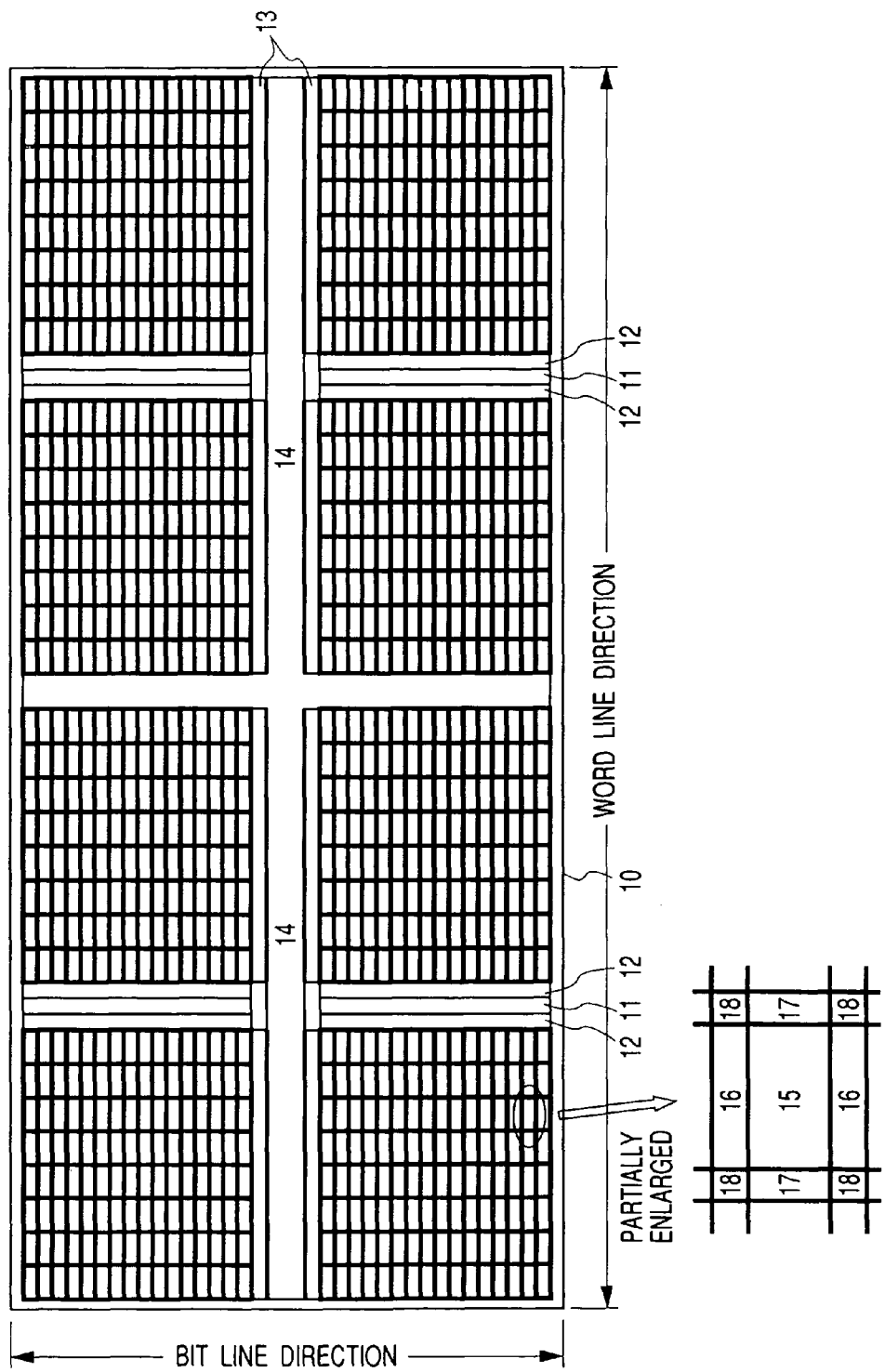
FIG. 1 is a diagram illustrating a layout of a dynamic RAM representing one preferred embodiment of the present invention.

Now, referring to FIG. 1, there is shown a general layout illustrating a dynamic RAM representing one preferred embodiment of the present invention. The figure illustrates the circuit blocks constituting the dynamic RAM that are associated with the present invention. These circuit blocks are formed on a single semiconductor substrate, such as silicon single crystal, by use of a known manufacturing technology for semiconductor integrated circuits.

In the present embodiment, a memory array is divided into four parts. To be more specific, the memory array is divided into four parts, two by two on the left and right sides along the length of the semiconductor chip. A central portion 14 is provided with an input/output interface circuit and so on composed of an address input circuit, a data input/output circuit, and a bonding pad row. The portions on both sides of the central portion 14 that come in contact with the memory array are arranged with a column decoder area 13.

The memory arrays arranged two by two on the left and right sides and two by two on the upper and lower levels along the length of the semiconductor chip are each provided in the vertical center portion thereof with two main row decoder areas 11. Each of the main row decoder areas is provided on both sides with main word driving circuits for driving the main word lines of the upper and lower memory arrays. The memory cell array (or sub array) 15 is formed between sense amplifiers 16 and sub word driving circuits 17 as shown in a partially enlarged diagram in FIG. 1. A portion at which the sense amplifier area and the sub word driving circuit area cross each other is referred to as a cross area 18. A sense amplifier provided in the sense amplifier area is based on shared sensing. Except for those sense amplifiers which are arranged on both sides of the memory cell array, a bit line pair is provided on the left and right sides of each sense amplifier which is selectively connected to one of the left and right complementary bit lines.

The dynamic RAM of the present embodiment has a storage capacity of about 64 Mbits (megabits). As described above, two by two memory arrays are arranged four by four on the left and right sides along the length of the semiconductor chip with the central portion 14 arranged with the input/output interface circuit and so on such as the address input circuit and the data input/output circuit, not shown.

As described, four pairs of memory arrays arranged along the length of the semiconductor chip are arranged two by two. The two memory arrays in each pair have the main word driving circuit 11 between them. This main word driving circuit 11 is provided for the memory arrays located above and below the main word driving circuit 11. The main word driving circuit 11 forms a select signal for selecting a main word line extended to penetrate one of the memory arrays. The main word driving circuit 11 is also provided with a sub word select driving circuit, which is extended in parallel to the main word line and forms a select signal for selecting a sub word line.

One memory cell array 15 shown in the partially enlarged diagram has 256 sub word lines and 256 bit line pairs (or data lines) intersecting the sub words orthogonally. On one memory array, system memory cell arrays (sub arrays) 15 are provided in the bit line direction. Therefore, as a whole, about 4K sub word lines are provided, eight in the word line direction, resulting in about 2K bit line pairs in total. Eight memory arrays are provided as a whole, resulting in a large storage capacity of 8×2K×4K=64 Mbits in total.

One memory array is divided into eight parts relative to the main word line. For each of the resultant memory cell arrays 15, a sub word driving circuit (sub word line driving circuit) 17 is provided. The sub word driving circuit 17 is divided by eight relative to the main word line, forming a select signal for selecting a sub word line extended in parallel thereto. In the present embodiment, in order to reduce the number of main word lines, or to ease the main word wiring pitch, eight sub word lines are arranged, but not exclusively, in the bit line pair direction for one main word line. Thus, in order to select one of the sub word lines divided into eight in the main word line direction and assigned in units of eight in the bit line pair direction, a sub word select driving circuit is arranged. This sub word select driving circuit forms a select signal for selecting one of the eight sub word select lines extended in the direction in which the sub word driving circuit is arranged.

Take one memory array for example. One sub word select line is selected from each of the eight memory cell arrays assigned to one main word line, so that eight sub word lines are selected from 8×6=64 sub word lines belonging to one main word line. Because 2K (2028) memory cells are provided in the main word line direction as described above, 2048/8=256 memory cells are connected to one sub word line. Thus, in the dynamic RAM, the eight sub word lines corresponding to one main word line are put in the selected state by considering the efficient execution of a refresh operation (for example, the refresh mode). It should be noted that one sub word line corresponding to one main word line may be put in the selected state. In this case, a new select signal line is required, but the power consumption of the dynamic RAM can be decreased.

As described above, one memory array has a storage capacity of 4 Kbits in the direction of a bit line pair. However, connecting a memory cell having as high a storage capacity as 4 Kbits to one bit line increases the parasitic capacity, so that the signal level to be read cannot be obtained due to the capacity ratio with a microscopic information storage capacitor. Consequently, each memory array is divided by 16 also in the bit line pair direction. Namely, the bit line pair is divided by 16 by the sense amplifier 16 indicated by a thick black line. The sense amplifier 16 is based on shared sensing and is selectively connected to one of the complementary bit lines on the left and right sides of the sense amplifier, except for those sense amplifiers located at both ends of the memory array.

Figure 2:
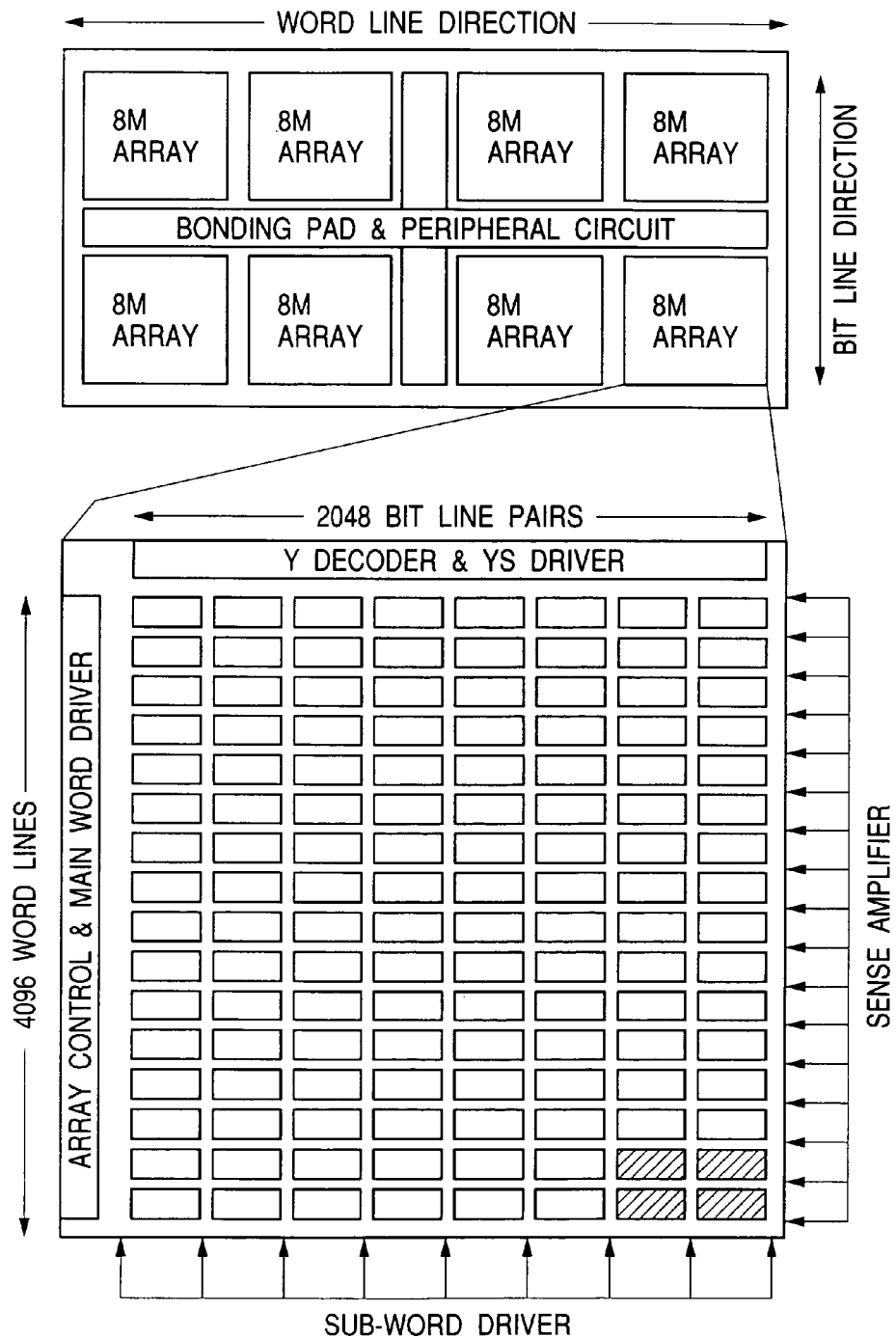
FIG. 2 is a diagram illustrating a general layout of the dynamic RAM associated with the present invention.

FIG. 2 is a diagram illustrating a general layout for describing the dynamic RAM associated with the present invention. FIG. 2 shows a general layout illustrating the entire memory chip and a layout illustrating one of the eight memory arrays constituting this memory chip. FIG. 2 shows the diagram illustrating the preferred embodiment of FIG. 1 from a different perspective. Namely, as is illustrated in FIG. 1, the memory chip is divided into two-by-two memory arrays along the length of the memory chip (in the word line direction). Between the upper and lower arrays, plural bonding pads and peripheral circuits are arranged. Each pair of the memory arrays has a storage capacity of about 8 Mbits and, as shown in the enlarged diagram, is divided by 8 in the word line direction and by 16 in the bit line direction, resulting in sub arrays. On both sides of each sub array, a sense amplifier is provided in the bit line direction. On both sides of each sub array, a sub word driving circuit is arranged in the word line direction.

One memory array is provided with 4,096 word lines and 2,048 bit line pairs in total. This constitution provides a storage capacity of about 8 Mbits for each memory array. As described above, the 4,096 word lines are divided into 16 sub arrays, so that one sub array has 256 word lines (sub word lines). Also, the 2,048 bit line pairs are divided into 8 sub arrays as described above, so that one sub array has 256 bit line pairs.

On the left side of the memory array, an array controller and a main word driving circuit are arranged corresponding to the above-mentioned main row decoder shared by the memory array to the left of the former memory array. The array controller has a driving circuit for driving a first sub word select line. Each memory array is arranged with the main word line such that the same is extended through the eight sub arrays. The above-mentioned main word driving circuit drives this main word line. Like the main word line, the sub word select line is also extended through the eight sub arrays. Over each memory array, a Y decoder and a Y select line driving circuit are provided.

Figure 3:
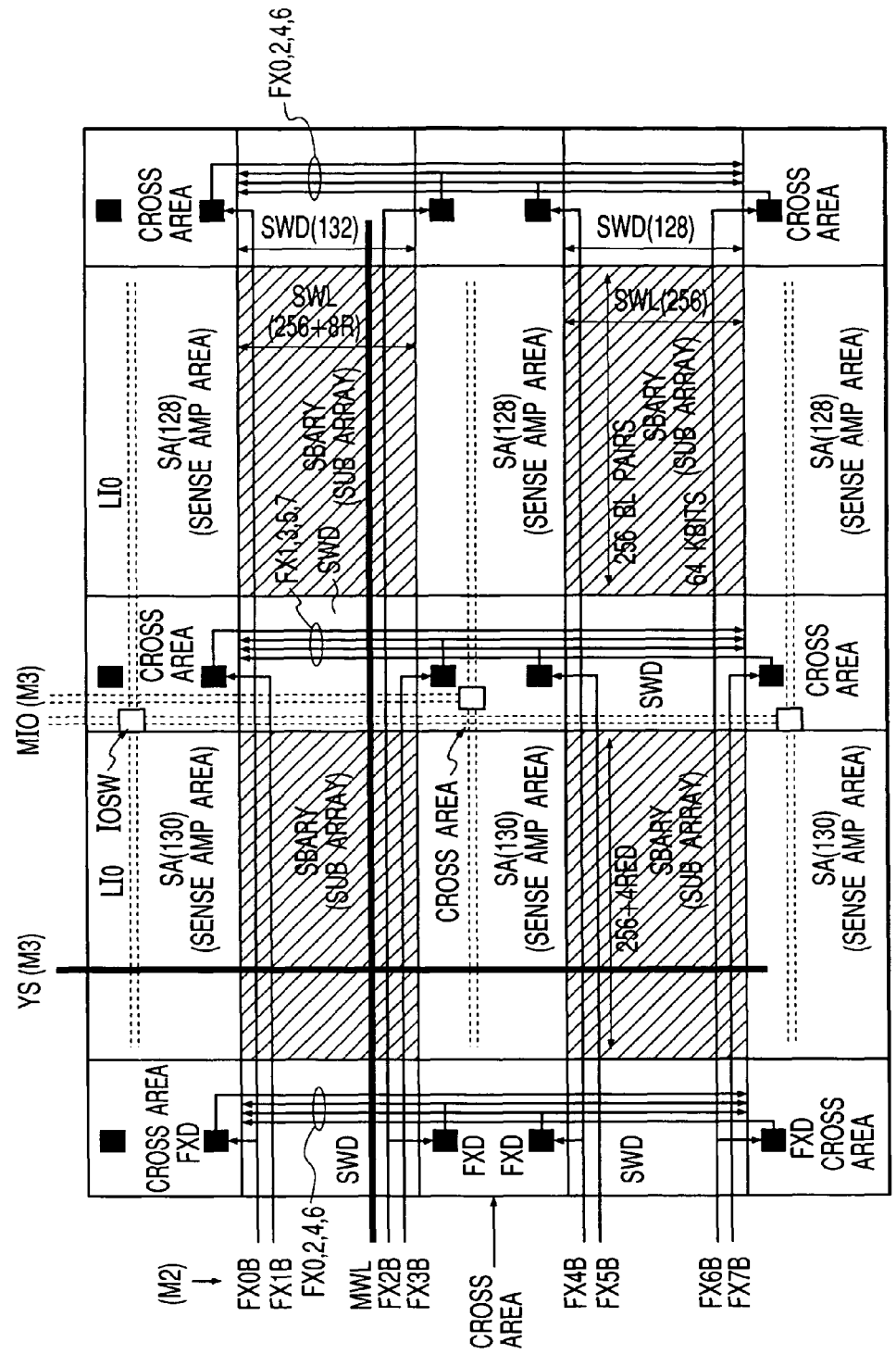
FIG. 3 is a diagram illustrating a general layout of a sub array in the dynamic RAM associated with the present invention and a peripheral circuit thereof representing one preferred embodiment of the present invention.

FIG. 3 is a general layout illustrating the sub array and its peripheral circuit in the dynamic RAM associated with the present invention, representing one preferred embodiment thereof. In the figure, four sub arrays SBARYs arranged in cross-hatched portions in the memory array shown in FIG. 2 are illustratively depicted. In the figure, the area in which each sub array SBARY is formed is cross-hatched to make a distinction from a sub word driving circuit area, a sense amplifier area, and a cross area which are formed around the sub array.

The sub arrays SBARYs are of four types. Namely, let the word line extension direction be the horizontal direction. Then, the sub array SBARY located in the lower right is provided with 256 sub word lines SWLs and 256 bit line pairs. Therefore, the 256 sub word driving circuits corresponding to the 256 sub word lines SWLs are divided into two groups of 128 which are arranged on the left and right sides of the sub array. The 256 sense amplifiers SAs provided for the 256 bit line pairs BLs are based on shared sensing as described above and are divided into two groups of 128 which are arranged above and below the sub array.

The sub array SBARY located in the upper right is provided with the normal 256 sub word lines SWLs and eight spare word lines. Therefore, 264 sub word driving circuits SWDs corresponding to these 256+8 sub word lines SWLs are divided into two groups of 132 which are arranged on the left and right sides of the sub array. As described above, the lower right sub array is composed of 256 bit line pairs and the 128 sense amplifiers are arranged above and below the sub array. The 128 bit line pairs arranged for each of the sub arrays in the upper and lower right are commonly connected to the sense amplifiers SAs arranged therebetween via a shared switch MOSFET.

The sub array SBARY arranged in the lower left is provided with 256 sub word lines SWLs like the sub array SBARY on the right side of this sub array. As described above, two groups of 128 sub word driving circuits are arranged on the left and right sides of the sub array. The two groups of 128 sub word lines SWLs arranged for the lower left and right sub arrays SBARYs are commonly connected to the 128 sub word driving circuits SWDs formed in the area between these sub arrays. As described above, the lower left sub array SBARY is provided with four pairs of spare bit lines REDs in addition to the normal 256 bit line pairs BLs. Therefore, 260 sense amplifiers SAs corresponding to the 260 bit line pairs are divided into two groups of 130 which are arranged above and below the sub array.

The sub array SBARY located in the upper left is provided with the normal 256 sub word lines SWLs and eight spare sub word lines Rs like the upper right sub array SBARY. The upper left sub array is also provided with the normal 256 bit line pairs and four spare bit line pairs like the lower left sub array. Therefore, two groups of sub word driving circuits 132 are provided on the left and right sides of the upper left sub array and two groups of sense amplifiers SAs are provided above and below this sub array.

A main word line MWL is extended as shown. In the figure, one main word line is illustratively depicted. A column select line YS is extended as shown. In the figure, one column select line is illustratively depicted. The sub word lines SWLs are arranged in parallel to the main word line MWL. The bit line pairs BLs (not shown) are arranged in parallel to the column select line YS. In the present embodiment, using the above-mentioned four sub arrays as a basic unit, eight sub sets of four arrays are formed in the bit line direction and four sets are formed in the word line direction in each memory array of 8 Mbits shown in FIG. 2. Since one set consists of four sub arrays, each memory array of 8 Mbits consists of 8×4×4=128 sub arrays. Since one memory chip consists of 8 memory arrays of 8 Mbits each, the entire memory chip has as many as 128×8=1,024 sub arrays.

Each set of four sub arrays is provided with eight sub word select lines FX0B through FX7B which are extended through four sets of the sub arrays (eight sub arrays) like the main word line MWL. Four sub word select lines FS0B through FX3B and four sub word select lines FX4B through FX7B are extended on the upper and lower sub arrays respectively. The set of sub word select lines FX0B through FX7B is assigned to two sub arrays and is extended on them to reduce the memory chip size.

To be more specific, if the above-mentioned eight sub word select lines are assigned to each sub array and formed in wiring channels on a sense amplifier, as many as 16 sub arrays are arranged for the upper and lower memory arrays to amount to 32 sub arrays, thereby requiring as many as 8×32=256 wiring channels. In the above-mentioned preferred embodiment, however, the wiring can be formed without providing a special wiring channel by assigning the above-mentioned eight sub word select lines FX0B through FX7B to the two sub arrays and extending these sub word select lines on the sub arrays.

Basically, each of the sub arrays is provided with one main word line for the eight sub word lines. The sub word select line is required to select one of the eight sub word lines. Because the main word line is formed for every eight sub word lines formed according to memory cell pitch, the wiring pitch of the main word lines is relatively widened. Therefore, use of the same wiring layer as that of the main word lines can form the sub word select lines between the main word lines comparatively easily.

The sub word driving circuit of the present preferred embodiment is constituted to select one sub word line SWL by a select signal supplied through the sub word select line FX0B or the like and a signal obtained by inverting this select signal. The sub word driving circuit is also constituted to simultaneously select the sub word lines SWLs of the sub arrays arranged on the left and right sides of the sub word driving circuit. Hence, for the two sub arrays as described above, the select signal is supplied to as many as 128×2=256 sub word driving circuits by allocating the above-mentioned four sub word select lines. Namely, take the sub word select line FX0B for example, the same is required to supply the select signal to as many as 256/4=64 sub word driving circuits.

Assuming the sub word select line to be extended in parallel to the main word line MWL is the first sub word select line FX0B, then a second sub word line FX0 is provided for supplying the select signal to the 64 sub word driving circuits arranged up and down via a sub word select line driving circuit FXD for receiving the select signal coming from the first sub word select line FX0B. While the first sub word select line FX0B is extended in parallel to the main word line MWL and the sub word line SWL, the second sub word select line is extended in parallel to the column select line YS and the bit line pair BL orthogonally intersecting the first sub word select line. For the above-mentioned eight first sub word select lines FX0B through FX7B, the second sub word select lines FX0 through FX7 are divided into two groups of even-numbered lines FX0, 2, 4 and 6 and odd-numbered lines FX1, 3, and 7, which are arranged for the sub word driving circuits SWDs on the left and right sides of the sub array SBARY.

As shown with a black square in FIG. 3, sub word select line driving circuits FXD are arranged two by two above and below the cross area. Namely, in the upper left cross area, the sub word select line driving circuit arranged in the lower portion corresponds to the above-mentioned first sub word select line FX0B, two sub word line select driving circuits FXDs arranged in the middle left portion correspond to the first sub word select lines FX2B and FX4B, and the sub word select line driving circuit arranged in the upper portion of the lower left cross area corresponds to the first sub word select line FX6B.

In the upper middle cross area, the sub word select line driving circuit arranged in the lower side corresponds to the first sub word select line FX1B, two sub word select line driving circuits FXDs arranged in the middle cross area correspond to the first sub word select lines FX3B and FX5B, and the sub word line select driving circuit arranged in the upper portion of the lower middle cross area corresponds to the first sub word select line FX7B. In the upper right cross area, the sub word select line driving circuit arranged in the lower side thereof corresponds to the first sub word select line FX0B, two sub word select line driving circuits FXDs arranged in the right middle portion correspond to the first sub word select lines FX2B and FX4B, and the sub word select line driving circuit arranged in the upper side of the lower right cross area corresponds to the first sub word select line FX6B. Thus, the sub word line driving circuits arranged in the end portion of the memory array drive only the left-side sub word lines SWLs because there is no sub array on the right of these sub word line driving circuits.

In the constitution in which the sub word lines are arranged between the main word lines, no special wiring channel is required, so that arranging the eight sub word select lines in one sub array does not increase the memory chip size. However, forming of the above-mentioned sub word select line driving circuits FXDs increases the area size, thereby preventing circuit integration from being enhanced. Namely, each of the above-mentioned cross areas has no margin in area for forming peripheral circuits including a switch circuit IOSW for a main input/output line MIO and a sub input/output line LIO indicated by dashed lines, a driving circuit for driving a power MOSFET and a shared switch MOSFET for driving the sense amplifiers, and a driving circuit for driving a precharge MOSFET.

As will be described, in each sub word driving circuit, the above-mentioned second sub word select lines FX0 through 4 are provided with wires for passing select signals corresponding to the first sub word select lines FX0B through 4B in parallel to the second sub word select lines. Because the load of these wires is small as will be described, no special driving circuit FXD such as the second sub word select lines FX0 through 4 is provided and the sub word driving circuit is constituted by the wires directly connected to the first sub word select lines FX0B through 4B. However, the wiring layer for these wires is the same as that of the second sub word select lines FX0 through 4.

Figure 4:
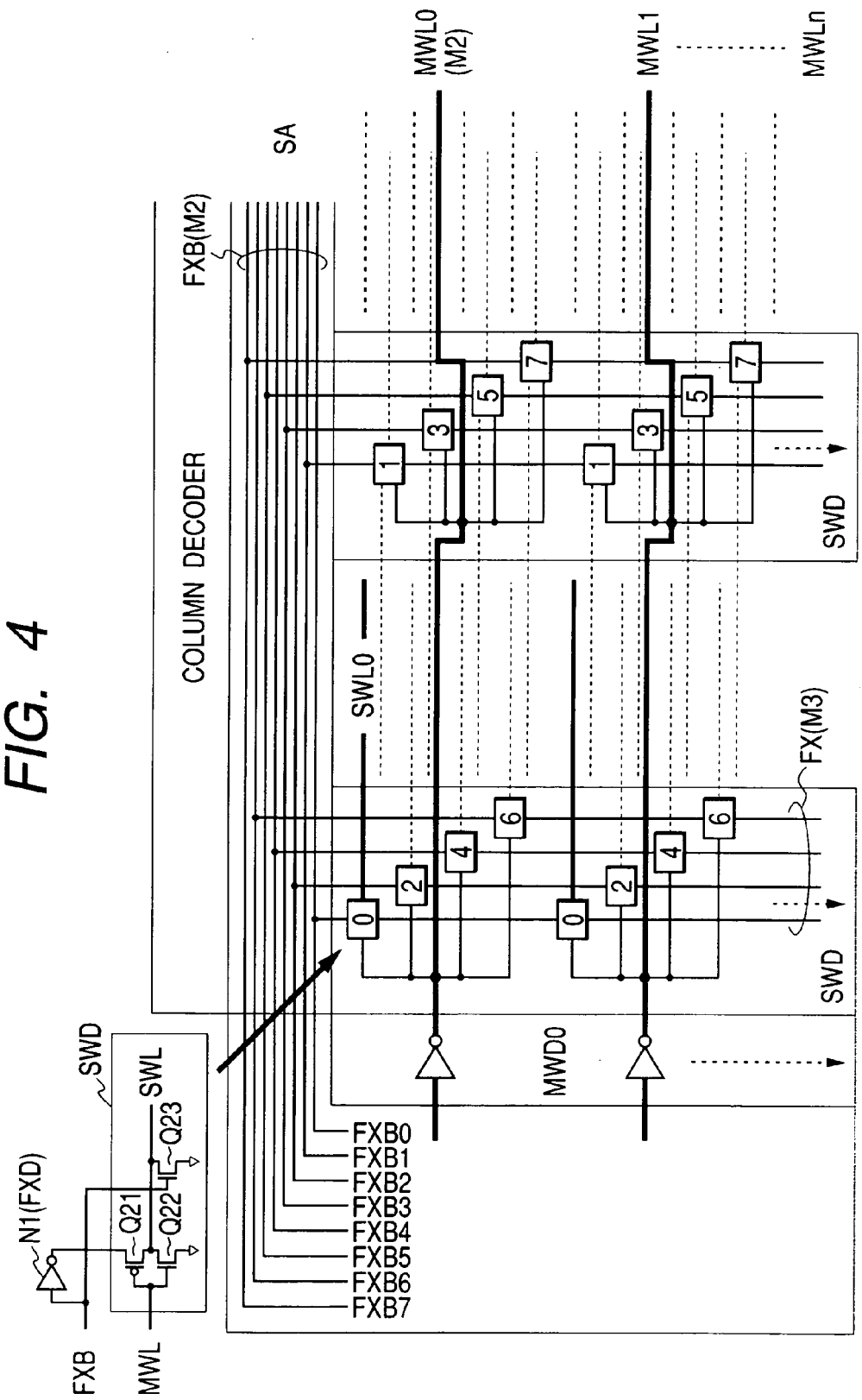
FIG. 4 is a schematic diagram illustrating a relationship between a main word and a sub word of a memory array shown in FIG. 1.

FIG. 4 is a main block diagram illustrating the relationship between the main word line and the sub word line in the above-mentioned sub array. This figure is for describing mainly the circuit operation, illustrating the sub word select lines FX0B through 7B with the above-mentioned geometrical arrangement of the sub word select lines ignored. In the figure, two main word lines MWL0 and MWL1 are typically illustrated for describing the sub word line selecting operation. The main word line MWL0 is selected by the main word driving circuit MWD0, while the main word line MWL1 is similarly selected by a similar main word driving circuit.

The main word line MWL0 is provided with eight sub word lines in its extended direction. FIG. 4 typically shows two sets of sub word lines. The eight sub word lines, even-numbered sub word lines 0 to 6 and odd-numbered sub word lines 1 to 7 are arranged on one sub array alternately. Except for the sub word lines 0 to 6 adjacent to the main word driving circuit and the sub word lines 1 to 7 arranged at the far-end side of the main word line (the side opposite to the word driving circuit), the sub word driving circuits arranged between the sub arrays drive the sub word lines of the sub arrays on the left and right sides of these sub word driving circuits.

Although there are eight sub arrays on the chip, the sub word lines corresponding to sub arrays are substantially selected by the sub word driving circuit SWD simultaneously, so that these sub arrays are divided into four sets substantially. In the above-mentioned constitution in which the sub word lines are divided into the even-numbered sub word lines 0 to 6 and the odd-numbered sub word lines 1 to 7 and each memory block is arranged between the sub word driving circuits SWDs, the substantial pitch of the sub word lines SWLs arranged with high density according to the memory cell arrangement can be eased twofold, thereby allowing efficient layout of the sub word driving circuits SWDs and the sub word lines SWLs on the semiconductor chip.

In the present embodiment, the above-mentioned sub word driving circuit SWD supplies a select signal from the main word line MWL commonly to the four sub word lines 0 to 6 (or 1 to 7). In order to select one of the above-mentioned four sub word lines, a sub word select line FXB is provided. The sub word select is composed of FXB0 through FXB7. The even-numbered FXB0 to FXB6 are supplied to the above-mentioned even-numbered sub word driving circuits 0 to 6, while the odd-numbered FXB1 to FXB7 are supplied to the above-mentioned odd-numbered sub word driving circuits 1 to 7.

The sub word select lines FXB0 through FXB7 are formed on the second metal wiring layer M2 on the sub array and are composed of the first sub word select lines extended in parallel to the main word lines MWL0 through MWLn formed on the second metal wiring layer M2 and the second sub word lines extended in the direction orthogonally intersecting the main word lines. The second sub word select lines are formed on the third metal wiring layer M3 because the second sub word select lines intersect the main word lines MWLs.

As typically illustrated in one unit, the sub word driving circuit SWD is composed of a first CMOS inverter made up of a p-channel MOSFET Q21 and an n-channel MOSFET Q22 of which input terminals are connected to the main word line MWL and of which output terminals are connected to the sub word line SWL and a switch MOSFET Q23 provided between the sub word line SWL and circuit ground potential to receive the above-mentioned sub word select signal FXB. In order to connect the gate of this switch MOSFET Q23, a total of eight sub word lines FX and FXB are actually arranged along the sub word driving circuits 0, 2, 4, and 6, which is indicated with one line in FIG. 4.

A second CMOS inverter N1 for forming an inverted signal FX of the above-mentioned sub word select signal FXB is provided as a sub word select line driving circuit FXD. The output signal of this circuit is supplied to the source terminal of the p-channel MOSFET Q21, which is the operating voltage terminal of the first CMOS inverter. This second CMOS inverter circuit N1 is formed in the cross area as shown in FIG. 3 and is shared by plural (64 in the above-mentioned preferred embodiment) sub word driving circuits SWDs.

In the above-mentioned sub word driving circuit SWD constitution, when the main word line MWL is high level, such as boosted voltage VPP corresponding to the select level of the word line, the n-channel MOSFET Q22 of the first CMOS inverter is turned on, setting the sub word line SWL to low level, such as to circuit ground potential. At this moment, the sub word select signal FXB goes low, such as to circuit ground potential. If the output signal of the second CMOS inverter N1 as the sub word select line driving circuit FXD is set to the selected level corresponding to the above-mentioned boosted voltage VPP, the p-channel MOSFET Q21 is in the OFF state by the unselected level of the main word line MWL. Therefore, the sub word line SWL is put in the unselected state caused by turning on of the n-channel MOSFET Q22.

When the main word line MWL is as low as circuit ground potential corresponding to the selected level, the n-channel MOSFET Q22 of the first CMOS inverter is turned off and the p-channel MOSFET Q21 is turned on. At this moment, if the sub word select signal FXB is low, such as circuit ground potential, the output signal of the second CMOS inverter N1 as the sub word select line driving circuit FXD is put in the selected level corresponding to the boosted voltage VPP, putting the sub word line SWL into the selected level as VPP. If the sub word select signal FXB is in the unselected level, such as boosted voltage VPP, the output signal of the second CMOS inverter N2 goes low, upon which the n-channel MOSFET Q23 is turned on to put the sub word line SWL into the unselected level, which is the low level.

The unselected levels of the main word line MWL and the first sub word select line FXB arranged in parallel thereto are both the high level, such as VPP. Therefore, if the insulation between the main word line MWL and the first sub word select line FXB, arranged in parallel to each other when the RAM is in the unselected (standby) state, is poor, no leakage current flows. As a result, the first sub word select line FXB can be formed between the main word lines MWLs to be arranged on the sub array, thereby preventing the occurrence of DC failure due to leakage current even if the layout is highly packed, resulting in high reliability of the dynamic RAM.

Figure 5:
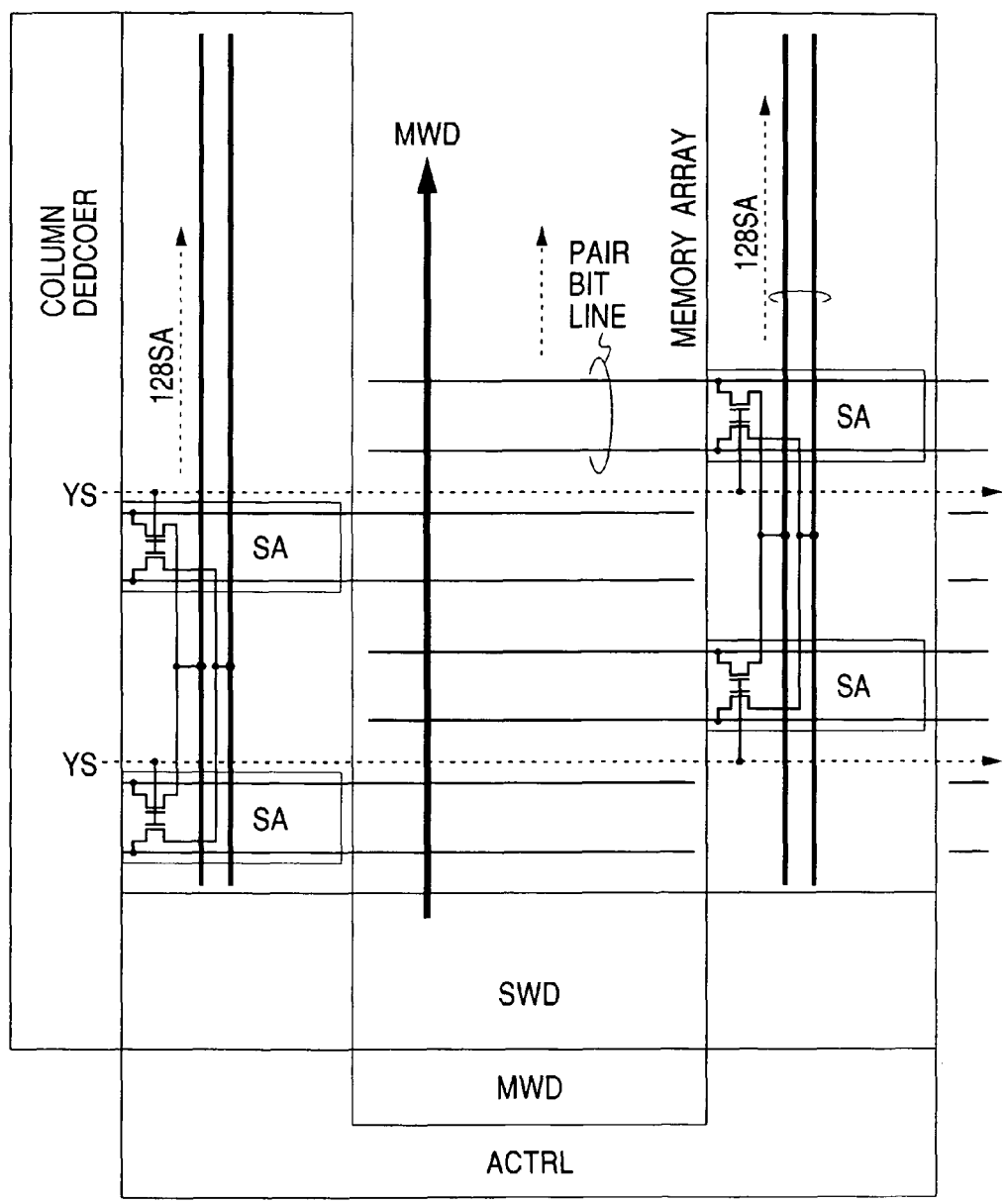
FIG. 5 is a schematic diagram illustrating a relationship between the main word line and a sense amplifier of the memory array shown in FIG. 1.

FIG. 5 is a main block diagram illustrating the relationship between the main word line and the sense amplifier of the above-mentioned memory array. In the figure, only one main word line MWL is illustrated typically. This main word line MWL is selected by a main word driving circuit MWD. Adjacent to this main word driving circuit, sub word driving circuits SWDs are provided corresponding to the above-mentioned even-numbered sub word lines.

Although not shown in FIG. 5, bit line pairs are arranged intersecting the sub word lines arranged in parallel to the main word line MWL. In the present preferred embodiment, complementary bit lines are also divided into even-numbered and odd-numbered groups. Sense amplifiers are arranged on the left and right sides of the sub array (memory cell array) corresponding to these groups. Each sense amplifier SA is based on shared sensing as described before. In the sense amplifier arranged at the end portion, the bit line pair which is substantially composed of only one line is not provided, but this sense amplifier is connected to the bit line pair via a shared switch MOSFET to be described later.

In the above-mentioned constitution in which the sense amplifiers SAs are arranged on both sides of the memory block in a distributive manner, the bit line pairs are dividedly arranged in odd-numbered and even-numbered columns. Consequently, the pitch of the sense amplifier columns can be eased. In other words, the device area for forming the sense amplifiers SAs can be allocated, while arranging the bit line pairs in high density. The above-mentioned sub input/output line is arranged along the arrangement of the sense amplifiers SAs. This sub input/output line is connected to the bit line pair via a column switch. This column switch is constituted by a switch MOSFET. The gate of this switch MOSFET is connected to a column select line YS to which a select signal of a column decoder is transmitted.

Figure 6:
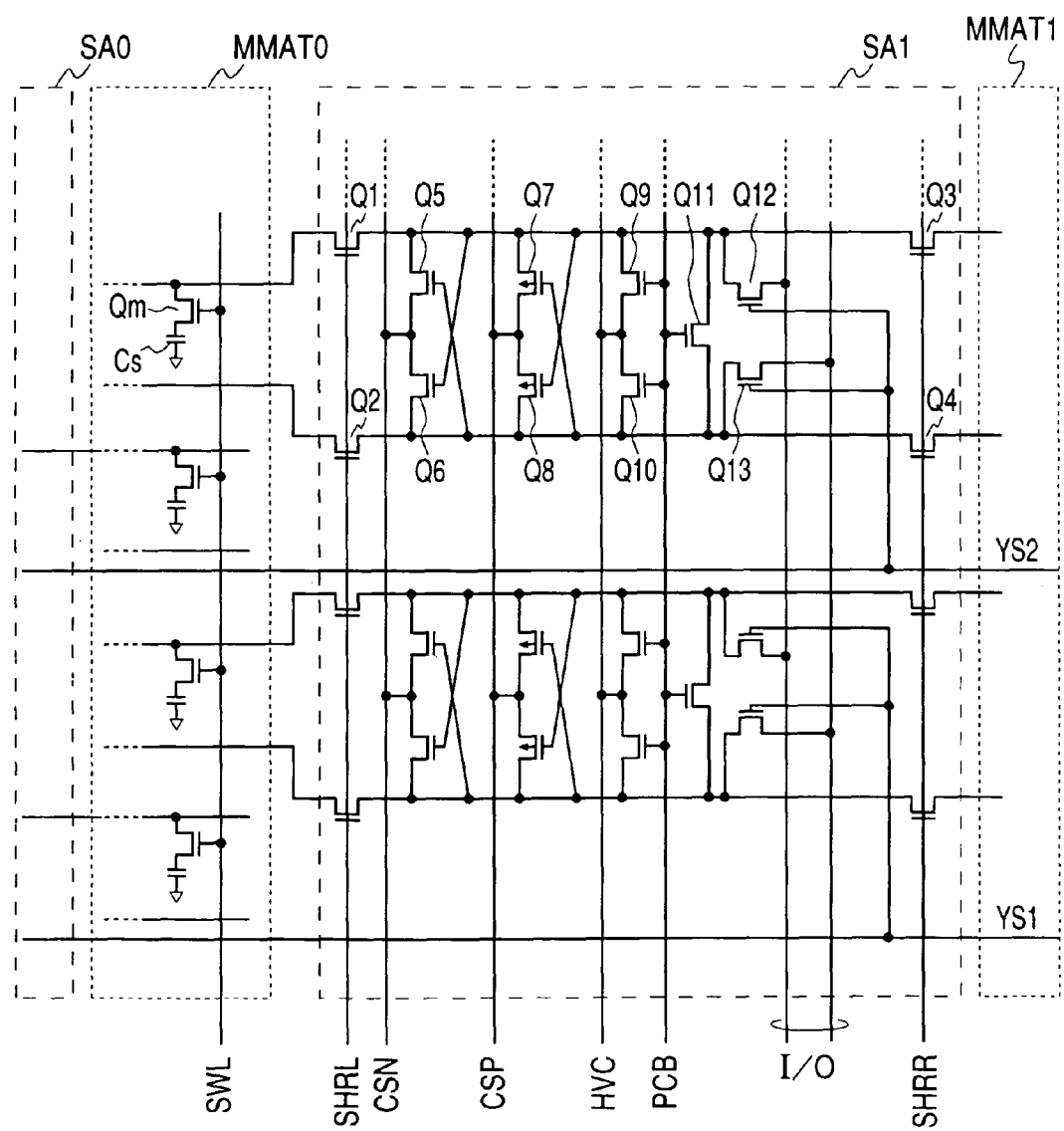
FIG. 6 is a schematic diagram illustrating a sense amplifier of the dynamic RAM associated with the present invention.

FIG. 6 is a circuit diagram illustrating the main portion of the sense amplifier of the dynamic RAM associated with the present invention, representing one preferred embodiment thereof. In the figure, a sense amplifier SA1 arranged between memory mats (above-mentioned sub arrays) MAT0 and MAT1 and circuits associated with the sense amplifier are illustrated. The memory mat MAT1 is shown as a black box and a sense amplifier SA0 provided at the end portion is also shown as a black box.

Four dynamic memory cells are typically illustrated for the sub word line SWL provided in the memory mat MMAT0. Each dynamic memory cell consists of an address select MOSFET Qm and an information storage capacitor Cs. The gate of the address select MOSFET Qm is connected to the sub word line SWL, the drain of this MOSFET Qm is connected to a bit line, and the source is connected to the information storage capacitor Cs. The other electrode of the information storage capacitor Cs is made common and supplied with the plate voltage. The select level of the sub word line SWL is the high voltage VPP which is raised by the threshold voltage of the address select MOSFET Qm relative to the high level of the above-mentioned bit line. For example, if the operation is made on the supply voltage VCC of the sense amplifier to be described later, the high level to be given to the bit line is set to the level corresponding to the supply voltage VCC, so that the high voltage VPP corresponding to the select level of the word line is set to VCC+Vth.

A pair of bit lines are arranged in parallel to each other as shown and appropriately cross each other to balance the bit line capacity. The complementary bit lines are connected to the input/output nodes of the unit circuit of each sense amplifier by shared switches MOSFETs Q1 and Q2. This unit circuit is constituted by n-channel MOSFETs Q5 and Q6 and p-channel MOSFETs Q7 and Q8 of which gates and drains are cross-connected into a latch. The sources of the n-channel MOSFETs Q5 and Q6 are connected to a common source line CSN. The sources of the p-channel MOSFETs Q7 and Q8 are connected to a common source line CSP. The common source lines CSN and CSP are provided with an n-channel power switch MOSFET and a p-channel power switch MOSFET respectively. These power switch MOSFETs are turned on by an activation signal of the sense amplifier to supply voltages necessary for sense amplifier operation, for example VCC and VSS.

The input/output nodes of the above-mentioned unit circuit of the sense amplifier are provided with a MOSFET Q11 for short-circuiting the bit line pair and a precharge circuit consisting of switch MOSFETs Q9 and Q10 for supplying a half precharge voltage HVC to the bit line pair. To the gates of these MOSFETs Q9 through Q11, a precharge signal PCB is commonly supplied. MOSFETs Q12 and Q13 constitute a column switch to be controlled by a column select signal YS. In the present preferred embodiment, four bit line pairs can be selected by one column select signal YS. Namely, the sense amplifier SA0 shown as a black box is also provided with a similar column switch. Thus, the two sense amplifiers SA0 and SA1 on both sides of the memory mat MMAT0 correspond to the even-numbered bit lines and the odd-numbered bit lines. Therefore, the above-mentioned column select signal YS selects a total of four bit line pairs, two illustrated on the side of the sense amplifier SA1 and the other two corresponding to the sense amplifier SA0 not shown. The two bit line pairs are connected to two pairs of the sub input/output lines I/Os and the remaining two bit line pairs are connected to the other two pairs of the sub input/output lines I/Os.

The sense amplifier SA1 is connected to the odd-numbered complementary bit lines of the memory mat MMAT1 via shared switch MOSFETs Q3 and Q4. The even-numbered complementary bit lines of the memory mat MMAT1 are connected to a sense amplifier SA2, not shown, arranged on the right side of the memory mat MMAT1 via shared switch MOSFETs corresponding to the above-mentioned shared switch MOSFETs Q1 and Q2. By such a repetitive pattern, the bit line pairs are connected to the sense amplifiers arranged between the memory mats (the above-mentioned memory blocks) obtained by dividing the memory array. For example, when the sub word line SWL of the memory mat MMAT0 is selected, the shared switch MOSFET on the right side of the sense amplifier SA0 and the shared switch MOSFET on the left side of the sense amplifier SA1 are turned on. However, only the right-side shared switch MOSFET is provided for the sense amplifier SA0 at the end portion. A signal SHRL selects the left-side shared switch MOSFET and a signal SHRR selects the right-side shared switch MOSFET.

Figure 7:
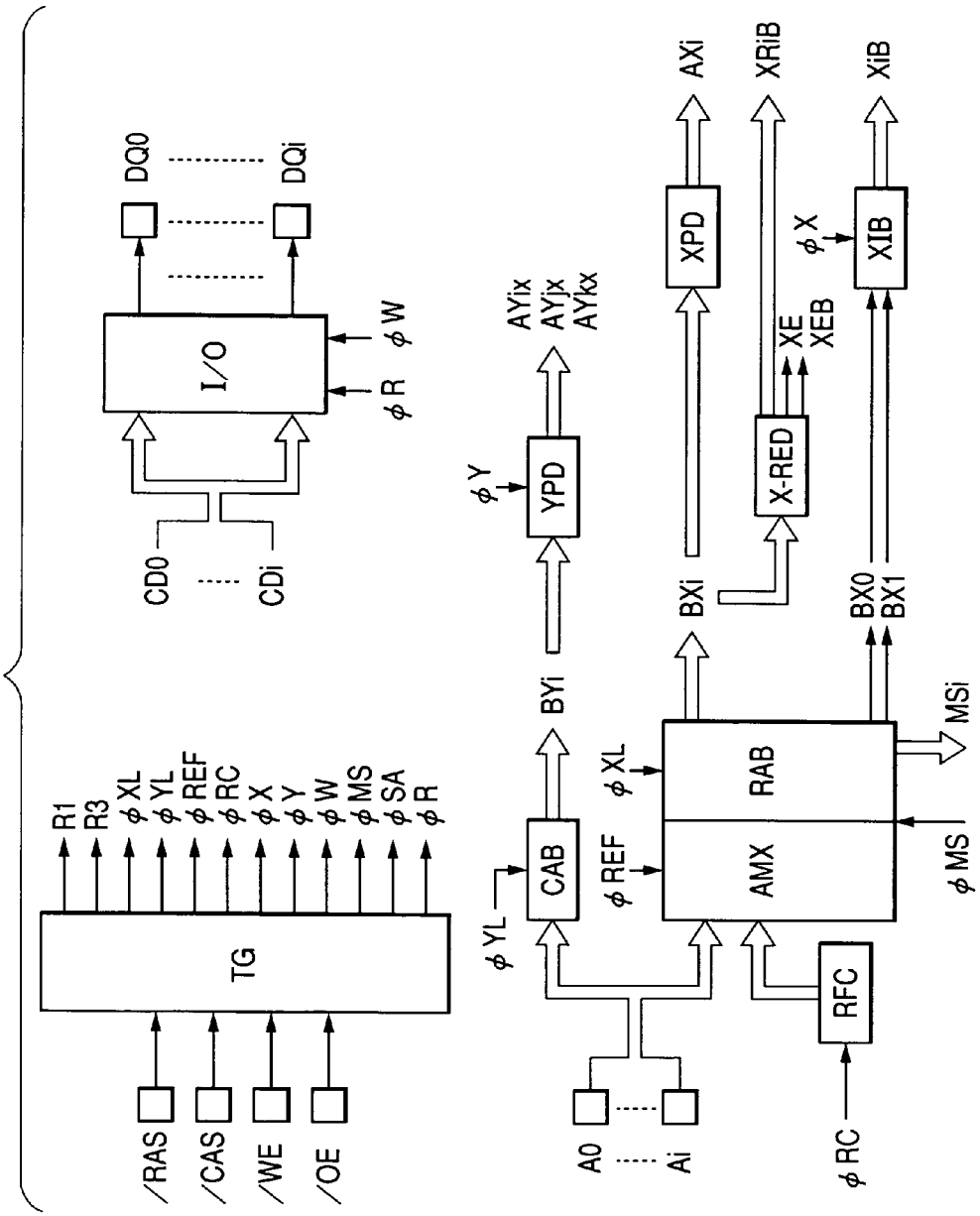
FIG. 7 is a schematic diagram illustrating a peripheral portion of the dynamic RAM associated with the present invention.

FIG. 7 is a general block diagram illustrating a peripheral portion of the dynamic RAM associated with the present invention, representing one preferred embodiment thereof. A timing controller TG receives a row address strobe signal/RAS, a column address strobe signal/CAS, a write enable signal/WE, and an output enable signal/OE from external terminals to determine an operating mode and generate timing signals necessary for the operations of internal circuits according to the determined operating mode. Slash (/) preceding each of the above-mentioned signals denotes an active low signal herein and in the drawings attached hereto.

Signals R1 and R3 are row-related internal timing signals to be used for row-related select operations. A timing signal φXL captures and holds a row-related address and is supplied to a row address buffer RAB. Namely, by the above-mentioned timing signal φXL, the row address buffer captures an address inputted from address terminals A0 through Ai and holds the captured address in a latch circuit. A timing signal φYL captures and holds a column-related address and is supplied to a column address buffer CAB. Namely, by the timing signal φYL, the column address buffer RAB captures an address inputted from the address terminals A0 through Ai and holds the captured address in the latch circuit.

A signal φREF is generated in the refresh mode and supplied to a multiplexer AMX provided in the input block of the row address buffer to switch to a refresh address signal formed by a refresh address counter RFC in the refresh mode. The refresh address counter RFC counts a clock pulse φRC for refreshing formed by the timing controller TG to generate a refresh address signal. In the present preferred embodiment, the auto refresh mode and the self refresh mode are provided as will be described. A timing signal φX is a word line select timing signal, which is supplied to a decoder XIB. Based on the decoded signal of an address signal of low-order two bits, four word line select timing signals XiB are formed. A timing signal φY is a column select timing signal, which is supplied to a column-related predecoder YPD to form column select signals AYix, AYjx, and AYkx.

A timing signal φW is a control signal for instructing a write operation. A timing signal φR is a control signal for instructing a read operation. These timing signals φW and φR are supplied to an input/output circuit I/O to activate the input buffer included in the input/output circuit I/O for a write operation, putting the output buffer thereof into the output high impedance state. For a read operation, these timing signals activate the output buffer to put the input buffer into the output high impedance state. A timing signal φMS is, though not exclusively, a signal for instructing a memory array select operation, which is supplied to the row address buffer RAB, from which a select signal MSi in synchronization with this timing. A timing signal φSA is a signal for instructing a sense amplifier operation. Based on this timing signal φSA, a sense amplifier activating pulse is formed.

In the present preferred embodiment, a row-related redundancy circuit X-RED is typically illustrated. Namely, the redundancy circuit X-RED includes a storage circuit for storing a faulty address and an address comparator. The stored faulty address is compared with an internal address signal BXi outputted from the row address buffer RAB. If a mismatch is found, a signal XE is made high and signal XEB is made low, validating the operation of the normal circuit. If a match is found between the inputted internal address signal BXi and the faulty address, the signal XE is made low to disable the select operation of the faulty main word line and the signal XEB is made high to output a select signal XRiB for selecting one spare main word line.

Figure 8:
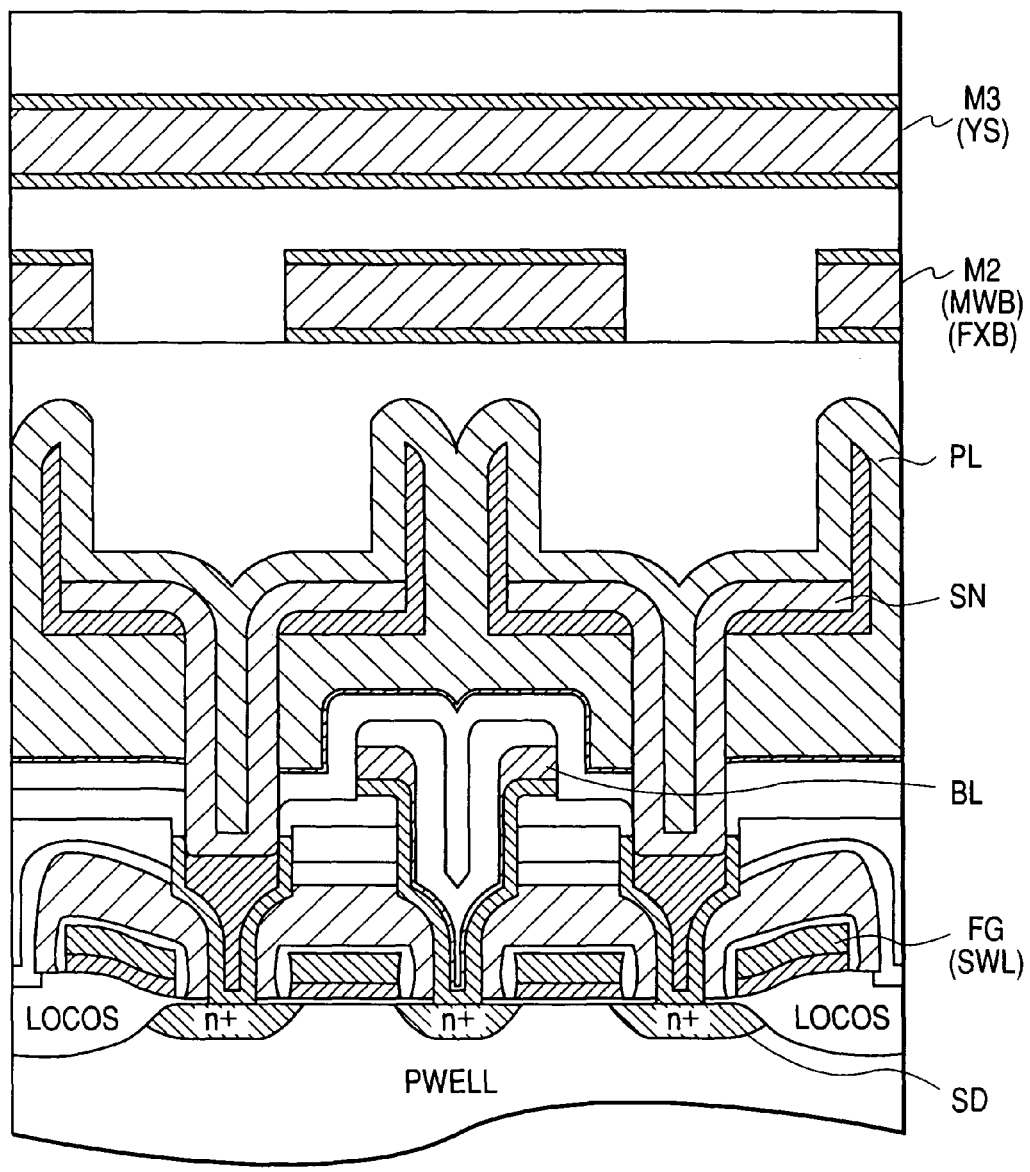
FIG. 8 is a cross section illustrating a device structure of a memory cell of the dynamic RAM associated with the present invention.

FIG. 8 is a cross section of the device structure for describing the dynamic RAM associated with the present invention. In the present referred embodiment, the device structure of the above-mentioned memory cell portion is typically illustrated. A storage capacitor of each memory cell uses the polysilicon layer, which is the second layer, as a storage node SN and is connected to one source and drain SD of the address select MOSFET. The storage node constituted by the polysilicon layer of the second layer has a crown structure formed with a plate electrode PL constituted by the polysilicon layer of the third layer via a thin gate insulation film. The gate of the address select MOSFET is integrally constituted with a sub word line SWL and is formed by the polysilicon layer of the first layer and a tungsten silicide (WSi) formed on top thereof. The other source-drain of the address select MOSFET is connected to a bit line BL constituted by a polysilicon layer and a tungsten silicide formed on top thereof. On top of the above-mentioned memory cell, the main word line MWB and sub word select line FXB constituted by the metal layer of the second layer M2 are formed, on which a Y select line YS and a sub word select line FX constituted by the metal layer of the third layer M3 are formed.

Although not shown in FIG. 8, an n-channel MOSFET and a p-channel MOSFET are formed around the memory cell for constituting a sub word driving circuit SWD and so on. To constitute these peripheral circuits, the metal layer of the first layer, not shown, is formed. For example, the wiring for connecting the gates of the n-channel MOSFET and the p-channel MOSFET for constituting the above-mentioned CMOS inverter uses the above-mentioned metal layer of the first layer M1. The input terminal of the above-mentioned CMOS inverter is connected to the main word line MWB constituted by the metal layer of the second layer M2 by leading to the metal layer of the first layer M1 as a dummy via a through-hole and connection is made to the gate electrode via the wiring layer of the first layer M1 and a contact.

Connection of the Y select line YS formed by the metal layer of the third layer M3 to the gate of the column select switch MOSFET or connection of the sub word select line FX formed by the metal layer M3 to the source and drain of the p-channel MOSFET of the sub word driving circuit is made by leading to the metal layer M2 and the metal layer M1 as dummy via the through-hole.

When the device structure such as that of the present preferred embodiment is employed, if a defect is caused in the insulation film between the metal layer of the second layer M2 constituting the main word line and the sub word line constituted by a portion of the metal layer of the second layer M2 extended in parallel to the metal layer of the second layer M2 or constituted by a portion of the metal layer of the third layer M3 intersecting the metal layer M2 of the main word line, a leakage current which cannot be ignored flows. Such a leakage current itself does not affect the memory cell read/write operations, practically presenting no problem. However, this causes a problem of a faulty current in the unselected state. The present invention does not cause the above-mentioned leakage current because the main word line MWB and the sub word line FXB are in the unselected state at the same potential.

If an error occurs in a memory cell read/write operation due to the leakage current between the main word line MWB and the sub word select line FXB, the main word line is replaced with a spare main word line. However, the faulty main word line MWB remains as it is, so that the leakage current continues to flow into the faulty main word MWB. Because the faulty main word line MWB is replaced with the spare main word line, this leakage current does not affect the memory read/write operation itself. Conventionally, this leakage current increases the DC current to deteriorate product performance and, in the worst case, DC failure occurs, thereby making such a defect remedial circuit vain. However, the above-mentioned novel constitution can circumvent such a problem.

Figure 9:
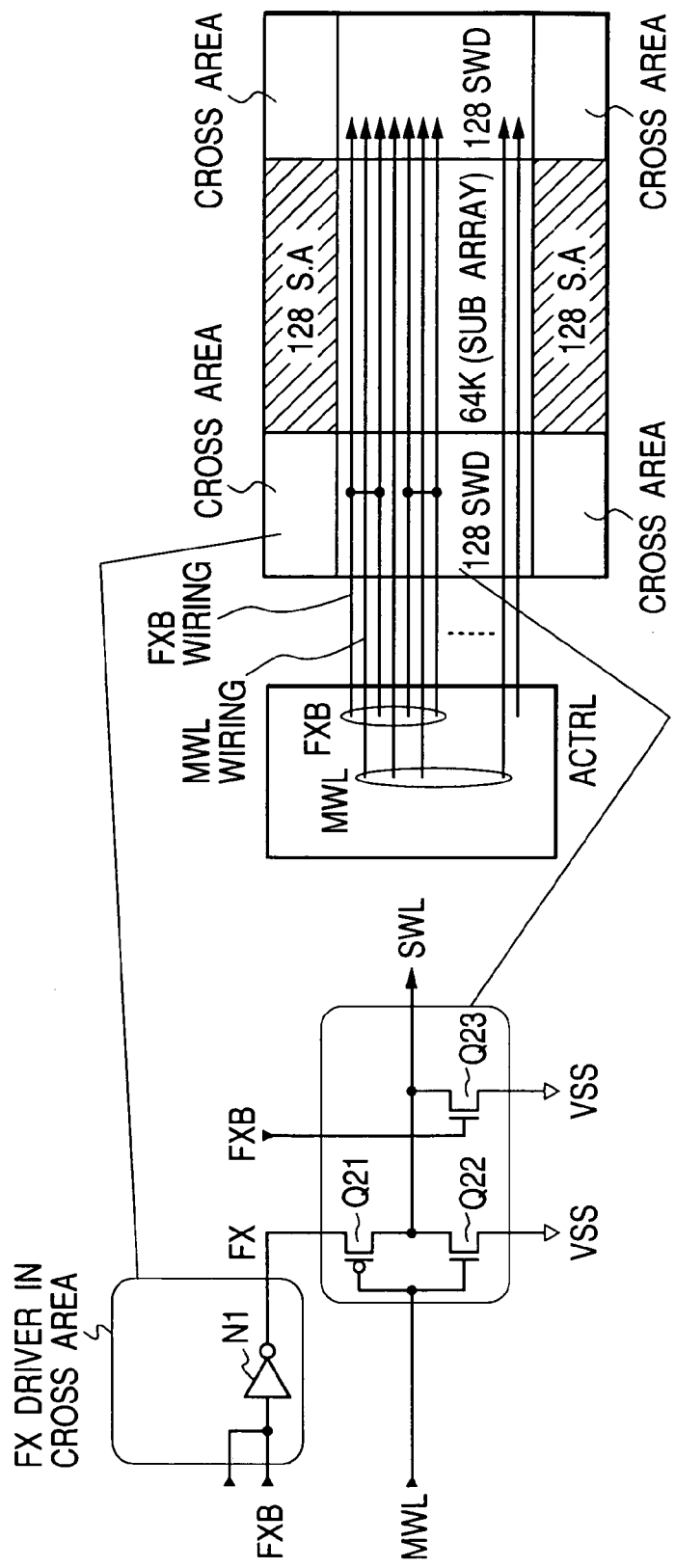
FIG. 9 is a diagram illustrating a general constitution of another preferred embodiment of the present invention.

FIG. 9 is a diagram illustrating a general constitution of another preferred embodiment of the present invention. In the figure, a circuit of the word line driving circuit is shown. One sub array and its peripheral circuit are also shown. As shown, the sub array has a storage capacity of 64 Kbits as described before. Namely, 256 sub word lines are provided for the two sets of 128 sub word driving circuits SWDs arranged on the left and right side of the above-mentioned sub array. Two sets of 128 sense amplifiers SAs are provided above and below. A total of 256 bit line pairs are provided for a total of 256 sense amplifiers. Therefore, a memory cell is provided at each intersection between the 256 word lines and the 256 bit line pairs, amounting to a storage capacity of 256×256=65,536 bits (about 64 Kbits) on one sub array.

On the above-mentioned sub array, main word lines are extended. In the present embodiment, the first and third of the three main lines from the top are arranged at both sides thereof with two pairs of sub word select lines, which are short-circuited by a sub word driving circuit area. This arrangement equivalently lowers the resistance of the sub word select lines by half, thereby realizing reduction of sub word select line resistance, eventually speeding up the sub word line select operation. As is evident from FIG. 3, two pairs of sub word select lines are arranged also below the memory array.

If the above-mentioned cross area has no margin, one sub word select line driving circuit may be provided for the four sub arrays. This constitution can reduce the number of sub word select line driving circuits provided in each cross area to one. Then, two pairs of sub word select lines may be extended on each sub array.

Figure 10A:
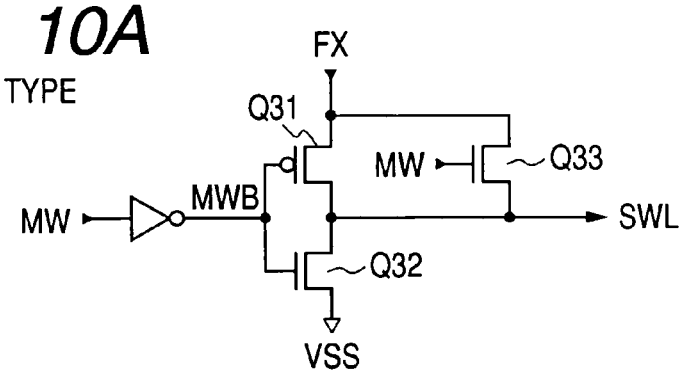
FIG. 10A, FIG. 10B, and FIG. 10C are circuit diagrams illustrating a sub word driving circuit of the dynamic RAM associated with the present invention, representing one preferred embodiment thereof.
Figure 10B:
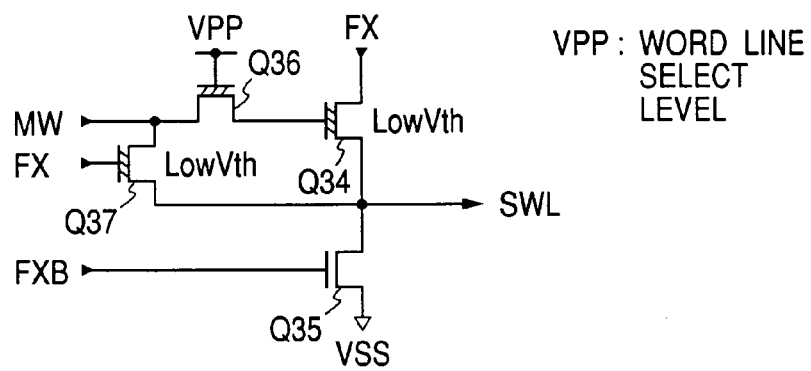
Figure 10C:
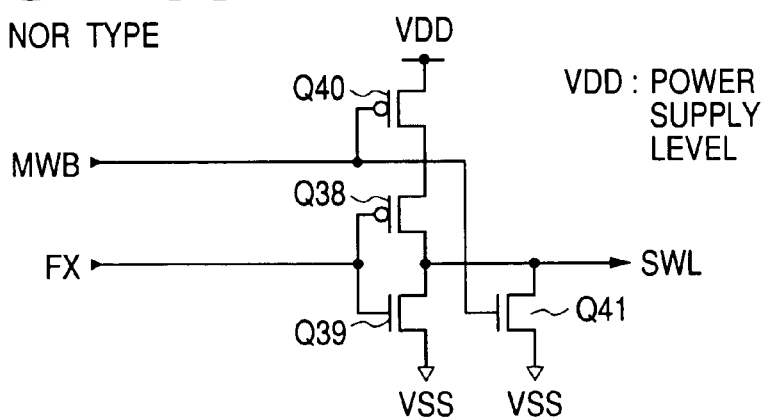

FIG. 10A, FIG. 10B, and FIG. 10C are circuit diagrams illustrating the above-mentioned sub word driving circuit representing another preferred embodiment of the present invention. FIG. 10A shows a CMOS type. The CMOS type is a CMOS inverter that receives a select signal MW of the main word line to form an inverted signal MWB and supplies the formed inverted signal to the gates of a p-channel MOSFET Q31 and an n-channel MOSFET Q32. The output terminal of the CMOS inverter composed of these MOSFETs Q31 and Q32 is connected to a sub word line SWL. At the same time, an n-channel MOSFET Q33 is provided in parallel to the above-mentioned p-channel MOSFET Q31. A sub word select signal FX is supplied to the source of the above-mentioned p-channel MOSFET Q31 and the above-mentioned main word select signal MW is supplied to the gate of the n-channel MOSFET Q33.

In the above-mentioned constitution, the sub word select signal is supplied with a boosted voltage VPP corresponding to the word line select level and the main word select signal MW is set to the high level corresponding to the boosted voltage VPP. This makes the inverted signal MWB low and turns on the p-channel MOSFET Q31, so that the sub word line SWL is put in the selected level corresponding to the above-mentioned boosted voltage VPP. If the main word select signal MW is at the low level, such as circuit ground potential, the inverted signal MWB is set to the high level, such as the boosted voltage VPP, turning off the p-channel MOSFET Q31 and turning on the n-channel MOSFET Q32, so that the sub word line SWL is put in the unselected state, such as the low level. The main word select signal MW is set to the high level, such as the boosted voltage VPP, upon which the MWB goes low to turn on the p-channel MOSFET Q31. At this moment, the sub word select signal FX is set to the low level such as circuit ground potential, causing the sub word line to float by the threshold voltage, so that, when the main word select signal MW goes high, the n-channel MOSFET Q33 is also turned on, thereby setting the potential of the sub word line SWL to the low level, such as ground potential.

In the present preferred embodiment, too, the unselected level of the main word line select signal MW and the unselected level of the sub word select signal can be set to the low level, such as circuit ground potential, so that, even if the main word line and the sub word select line are formed by use of the same wiring layer on the memory array, no trouble due to the above-mentioned leakage current takes place.

FIG. 10B shows an NMOS type. The NMOS type tunes on/off, in a complementary manner, a MOSFET Q34 on the supply voltage side of low threshold voltage and a MOSFET Q35 on the circuit ground potential side to put the sub word line SWL into the selected/unselected state. The gate of the above-mentioned MOSFET Q34 is provided with a low-threshold voltage cutting MOSFET Q36 that transmits the main word select signal MW and is regularly supplied with the boosted voltage VPP. Between the main word line select signal MW and the sub word line SWL, a low-threshold voltage MOSFET Q37 is provided to which the sub word select signal FX is supplied.

In the present embodiment, when the sub word select signal FX is the boosted voltage VPP and the main word line MW is high, the sub word line SWL is set to the high level corresponding to the boosted voltage. Namely, when the main word select signal MW goes high, the MOSFET Q34 is turned on, and when the sub word select signal FX goes high, self boosting is applied in the MOSFET Q34, so that the sub word line SWL is raised to the boosted voltage VPP while using the n-channel MOSFET Q34. If the sub word select signal FXB is high and the sub word select signal FX is low, the sub word line SWL is set to the low level, such as circuit ground potential when the MOSFET Q35 is turned on and the MOSFET Q34 is turned on by the main word select signal MW. Because the sub word select signal FX requires a current supply capability sufficient for driving the sub word line SWL, the cross area is provided with a sub word select line driving circuit. Therefore, the word line MW and the sub word select signal FXB may be arranged on the sub array.

FIG. 10C shows a NOR type. For a CMOS inverter composed of a p-channel MOSFET Q38 and an n-channel MOSFET Q39, a p-channel switch MOSFET Q40 constituted by a p-channel MOSFET Q40 is provided. Between the sub word line SWL and the circuit ground potential, an n-channel MOSFET Q41 is provided. The input of the above-mentioned CMOS inverter is supplied with the sub word select signal FX and the above-mentioned p-channel and n-channel MOSFETs Q40 and Q41 are supplied with the above-mentioned main word select signal MWB.

In the above-mentioned constitution, the select level of the sub word line SWL is set to the supply voltage VDD. Therefore, an operating voltage is used which is obtained by lowering the sense amplifier operating voltage from the supply voltage VDD by the threshold voltage of the memory cell address select MOSFET. In this constitution, the sub word select line driving circuit is not required, thereby providing a margin for the above-mentioned cross area. Consequently, a set of eight sub word select lines FXs for example can be extended for one row of sub arrays. If the supply voltage VDD is the boosted voltage VPP, then the sense amplifier operating voltage can be set to the supply voltage VDD.

The above-mentioned preferred embodiments of the present invention provide the following advantages:

(1) A plurality of sub word lines each having a length equivalent to the division of a main word line along the extension direction thereof, arranged along a bit line crossing the main word line, and connected with a plurality of memory cells, are provided. A first sub word select line arranged in parallel to the main word line is extended to a plurality of sub arrays arranged in the extension direction of the word line. A second sub word select line is connected to a corresponding one of the first sub word select lines to be extended to a word line driving circuit area of an adjacent sub array. In the sub word line driving circuit provided for each sub array, a sub word line is selected and deselected by signals supplied from the main word line and the second sub word select line. This novel constitution realizes high integration while using the divided word line scheme.

(2) Sub word line driving circuits are dividedly arranged on both ends of a plurality of sub word line arrays and sense amplifiers are dividedly arranged on both ends of a plurality of bit line pair arrays. Each sub array is formed to be surrounded by the sub word line driving circuit row and the sense amplifier row. This novel constitution allows the arrangement of the sub word line driving circuits and the sense amplifiers in a pitch two times as high as the wiring pitch of the sub word lines and the bit line pairs arranged on each sub array in high density.

(3) The above-mentioned sense amplifiers are based on shared sensing and are provided for the bit lines of the adjacent sub arrays to select the sub word lines of the adjacent sub arrays around the above-mentioned sub word line driving circuit. This novel constitution allows efficient arrangement of the sub arrays and their driving circuits and sense amplifiers.

(4) The above-mentioned main word line is an inverted main word line of which the selected level is the low level and the second sub word select line is composed of a non-inverted sub word select line of which the selected level is the high level and an inverted sub word select line of which the selected level is the low level, the above-mentioned sub word line driving circuit comprising: a first CMOS inverter circuit composed of a p-channel MOSFET of which the source is connected to the non-inverted sub word select line; an n-channel MOSFET of which source is connected to ground potential, the main word line being connected to an input terminal composed of the commonly connected gates of these transistors, the sub word line being connected to an output terminal of these transistors; and an n-channel MOSFET of which a source and drain path is provided between the sub word line and circuit ground potential and of which a gate is connected to the inverted sub word line; wherein the inverted sub word line is connected to the first sub word select line and the non-inverted sub word select line is supplied with a select signal formed by an inverter circuit of which an input terminal is connected to the first sub word select line. This novel constitution can efficiently constitute the sub word line driving circuit with a relatively small number of devices.

(5) The above-mentioned sub word select line driving circuit is arranged in the cross area between the above-mentioned sense amplifier row and the sub word line driving circuit row, thereby efficiently arranging the sub word line driving circuits.

(6) The above-mentioned sub word select lines are arranged between the main words and formed on the same wiring layer as that of the main word lines. The two wiring layers arranged above and below that wiring layer are short-circuited to be used as one first sub word line, the resistance of the sub word line can be lowered, which in turn increases the sub word line operating speed.

(7) The main word lines and the first sub word select lines are formed on the metal layer of the second layer. The second sub word select lines are formed on the metal layer of the third layer, the metal layer of the second layer, and the metal layer of the first layer. The portion intersecting the main word line is formed on the metal layer of the third layer. The portion connected to the circuit devices constituting the sub word line driving circuit is formed on the metal layer of the first layer. This novel constitution allows an efficient arrangement of the main word lines, the first sub word select lines, and the second sub word select lines.

While the preferred embodiments of the present invention have been described using specific terms, such description is for illustrative purposes only, and it is to be understood that changes and variations may be made without departing from the spirit or scope of the appended claims. For example, the constitution of each sub array or the arrangement of the plurality of memory arrays mounted on a semiconductor chip may take various forms according to the storage capacity and so on of these arrays. Also, the constitution of the sub word driving circuit may take various forms. The input/output interface block may also be a synchronous dynamic RAM adapted to operate in synchronization with the clock signal. The number of sub word lines to be allocated to one main word line may be eight or another number in addition to the above-mentioned four. The present invention is widely applicable to dynamic RAMs of divided word line type having main word lines and sub word lines.

The advantages to be typically provided by the present invention are as outlined below. Namely, a plurality of sub word lines each having a length equivalent to the division of a main word line along the extension direction thereof, arranged along a bit line crossing the main word line, and connected with a plurality of memory cells, are provided. A first sub word select line arranged in parallel to the main word line is extended to a plurality of sub arrays arranged in the extension direction of the word line. A second sub word select line is connected to the corresponding one of the first sub word select line to be extended to a word line driving circuit area of an adjacent sub array. In the sub word line driving circuit provided for each sub array, a sub word line is selected and deselected by signals supplied from the main word line and the second sub word select line. This novel constitution realizes high integration while using the divided word line scheme.

What is claimed is:
1. A dynamic random access memory comprising:
a plurality of memory cell areas arranged in an array, each of which has a plurality of sub word lines, a plurality of bit lines orthogonally intersecting said plurality of sub word lines, and a plurality of dynamic memory cells provided at intersections between said plurality of sub word lines and said plurality of bit lines;
a plurality of first areas, each of which includes a sub word line driving circuit and is arranged between said plurality of memory cell array areas adjacent to each other along the extended direction of said plurality of sub word lines;
a plurality of second areas, each of which includes a sense amplifier circuit and is arranged between said memory array areas adjacent to each other along the extended direction of said plurality of bit lines;
a plurality of third areas, each of which is arranged between said plurality of first areas adjacent to each other;
a plurality of main word lines, each of which is extended over said plurality of first areas and said plurality of memory cell array areas and is assigned with two or more sub word lines in each corresponding memory array cell area;
a plurality of first select lines, which are arranged in parallel to said plurality of main word lines to transmit a select signal for selecting one of said two or more sub word lines assigned to a predetermined one of said plurality of main word lines; and
a plurality of second select lines, which are connected to said plurality of first select lines and are extended over adjacent ones of said plurality of first areas via predetermined one of said plurality of third areas to transmit said select signal to said sub word line driving circuit of each of said plurality of first areas adjacent to each other;
wherein one of said plurality of sub word lines assigned to the select main word line is selected by the predetermined sub word line driving circuit that receives a signal from said plurality of second select lines and a signal from said selected main word line.

2. A dynamic random access memory of claim 1, further comprising:
a plurality of second select line driving circuits, which receive a signal from said plurality of first select lines to drive a corresponding one of said plurality of second select lines;
wherein said plurality of second select line driving circuits are arranged, in a distributed manner, in said plurality of third areas arranged along the extended direction of said plurality of second select lines.

3. A dynamic random access memory of claim 2, wherein each of said plurality of second select lines has a pair of signal lines for transmitting complementary signals, one of said complementary signals being a first signal in phase with the signal received from corresponding one of said plurality of first select lines, the other of said complementary signals being a second signal formed by a corresponding one of said plurality of second select line driving circuits.

4. A dynamic random access memory of claim 3, wherein said sub word line driving circuit includes a first MOSFET of which a gate is connected to a corresponding one of said plurality of main word lines and a source-drain path is arranged between the second select line for receiving said second signal and the sub word line.

5. A dynamic random access memory of claim 4, wherein said sub word line driving circuit includes a second MOSFET of which a gate is connected to the second select line for receiving said first signal and of which a source-drain path is arranged between the sub word line and a power supply line.

6. A dynamic random access memory of claim 1, wherein each of said plurality of first select lines is constituted by a pair of signal lines each for transmitting the same signal, said pair of signal lines being arranged to sandwich one of said plurality of main word lines.

7. Dynamic random access memory of claim 6, wherein said plurality of select lines and said plurality of main word lines are formed by a first metal layer and said pair of signal lines are short-circuited in said first area by use of a second metal layer formed on a layer different from said first metal layer.

8. A dynamic random access memory, comprising:
a main word line;
a plurality of bit line pairs intersecting said main word line;
a plurality of dynamic memory cells;
a plurality of sub word lines each of which has a length equivalent to a division of said main word line and has the extended direction of said main word line, arranged in plurality toward the direction of the bit line, and connected to address select terminals of said plurality of dynamic memory cells;
a first sub word select line extended in parallel to said main word to transmit a select signal for selecting one of the plurality of sub word lines assigned to said main word line;
a second sub word select line connected to a corresponding one of said first sub word select lines and extended to intersect said main word line;
a plurality of sub word line driving circuits for receiving a select signal from said main word line and a select signal from said second sub word line to form a select signal of said sub word line; and
a plurality of sense amplifier circuits of which input/output pins are connected to said plurality of bit line pairs;
wherein said main word line and said first sub word select line are arranged on a plurality of sub arrays composed of said plurality of sub word lines, said plurality of bit line pairs, and said plurality of dynamic memory cells arranged at intersections between said plurality of sub word lines and said plurality of bit line pairs and said second sub word select line is extended to said sub word driving circuit corresponding to a second sub array adjacent to a first sub array of said plurality of sub arrays to supply the select signal to the corresponding sub word line driving circuit.

9. A dynamic random access memory of claim 8, wherein the sub word line driving circuits are arranged in a divided manner, on both ends of said plurality of sub word line arrays, the sense amplifier circuits are arranged, in a divided manner, on both ends of said plurality of bit line pair arrays, and each of said plurality of sub arrays is formed between said plurality of sub word line driving circuit rows and said plurality of sense amplifier circuit rows.

10. A dynamic random access memory of claim 8 or 9, wherein said sense amplifier is based on shared sensing and is provided for the bit lines of the adjacent sub arrays around said sense amplifier and said sub word line driving circuit selects the sub word line of the adjacent sub arrays around said sub word line driving circuit.

11. A dynamic random access memory of claim 8, wherein said main word line is an inverted main word line of which the selected level is the low level and said second sub word select line is composed of a non-inverted sub word select line of which the selected level is the high level and an inverted sub word select line of which the selected level is the low level,
said sub word line driving circuit comprising:
a first complementary metal oxide semiconductor inverter circuit composed of a p-channel MOSFET of which the source is connected to said non-inverted sub word select line and an n-channel MOSFET of which the source is connected to ground potential, said main word line being connected to an input terminal composed of the commonly connected gates of these MOSFETs, said sub word line being connected to an output terminal of these MOSFETs; and
an n-channel MOSFET of which a source and drain path is provided between said sub word line and said circuit ground potential and of which a gate is connected to said inverted sub word line;
wherein said inverted sub word line is connected to said first sub word select line and said non-inverted sub word select line is supplied with a select signal formed by an inverter circuit of which an input terminal is connected to said first sub word select line.

12. A dynamic random access memory of claim 11, wherein said inverter circuit is arranged in a cross area where said sense amplifier row and said sub word line driving circuit row intersect.

13. A dynamic random access memory of claim 8, wherein said first sub word select line is formed by use of the same wiring layer as that of the main word line and two wiring layers sandwiching one main word line are short-circuited to be used as one first sub word select line.

14. A dynamic random access memory of claim 8, 11, or 12, wherein said main word line and said first sub word select line are formed by a metal layer of a second layer, said second sub word select line is extended using a metal layer of a third layer, the metal layer of said third layer is used at a portion intersecting said main word line, and a metal layer of a first layer is used at a portion connected to a circuit element constituting said sub word line driving circuit.

* * * * *